US012610630B2

(12) United States Patent
Kimura

(10) Patent No.: US 12,610,630 B2
(45) Date of Patent: Apr. 21, 2026

(54) METHOD OF MANUFACTURING A LIGHT-RECEIVING ELEMENT AND LIGHT-RECEIVING ELEMENT

(71) Applicant: Sumitomo Electric Industries, Ltd., Osaka (JP)

(72) Inventor: Daisuke Kimura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 333 days.

(21) Appl. No.: 18/196,638

(22) Filed: May 12, 2023

(65) Prior Publication Data

US 2024/0047590 A1 Feb. 8, 2024

(30) Foreign Application Priority Data

Aug. 5, 2022 (JP) ................................. 2022-125561

(51) Int. Cl.
| *H10F 39/00* | (2025.01) |
| *H01L 21/762* | (2006.01) |
| *H10F 39/12* | (2025.01) |
| *H10F 71/00* | (2025.01) |
| *H10F 77/169* | (2025.01) |

(52) U.S. Cl.
CPC ........... *H10F 39/011* (2025.01); *H10F 39/12* (2025.01); *H10F 39/807* (2025.01); *H10F 71/139* (2025.01); *H10F 77/169* (2025.01); *H01L 21/76224* (2013.01)

(58) Field of Classification Search
CPC ...... H10F 39/12; H10F 39/011; H10F 77/211; H10F 77/219; H10F 77/14; H10F 39/807; H10F 39/014; H10F 39/021; H10F 71/121; H10F 71/137; H01L 21/76224; H01L 77/133; H10H 20/83; H10H 20/831; H10H 20/8312
See application file for complete search history.

(56) References Cited

U.S. PATENT DOCUMENTS

| 2016/0284876 A1* | 9/2016 | Yagi ..................... H10F 77/413 |
| 2018/0342545 A1 | 11/2018 | Kimura et al. |
| 2021/0126157 A1* | 4/2021 | Dupre ................... H10F 77/206 |
| 2021/0408340 A1* | 12/2021 | Kishimoto ........... H10H 20/832 |

FOREIGN PATENT DOCUMENTS

| JP | 2018200956 A | 12/2018 |
| JP | 2020017672 A | 1/2020 |
| JP | 2020-047639 A | 3/2020 |

* cited by examiner

*Primary Examiner* — Alia Sabur

(74) *Attorney, Agent, or Firm* — Volpe Koenig

(57) ABSTRACT

A method of manufacturing a light-receiving element of the present disclosure includes forming a first contact layer at one surface of a substrate, forming a light receiving layer on the first contact layer, forming a second contact layer on the light receiving layer, removing a portion of each of the second contact layer, the light receiving layer, and the first contact layer and forming a first groove at which the first contact layer is exposed, filling the first groove with a resin, and after filling the first groove with the resin, removing the second contact layer and forming a second groove separating pixels.

5 Claims, 14 Drawing Sheets

METHOD OF MANUFACTURING A LIGHT-RECEIVING ELEMENT AND LIGHT-RECEIVING ELEMENT

CROSS REFERENCE TO RELATED APPLICATIONS

This application claims priority based on Japanese Patent Application No. 2022-125561, filed on Aug. 5, 2022, and the entire contents of the Japanese patent application are incorporated herein by reference.

TECHNICAL FIELD

The present disclosure relates to a method of manufacturing a light-receiving element and to a light-receiving element.

BACKGROUND

A two dimensional array type light-receiving element in which pixels separated by grooves are two dimensionally arranged is known (for example, see PTL 1).

PTL 1: Japanese Unexamined Patent Application Publication No. 2020-47639

SUMMARY

A method of manufacturing a light-receiving element of the present disclosure includes forming a first contact layer at one surface of a substrate, forming a light receiving layer on the first contact layer, forming a second contact layer on the light receiving layer, removing a portion of each of the second contact layer, the light receiving layer, and the first contact layer and forming a first groove at which the first contact layer is exposed, filling the first groove with a resin, and after filling the first groove with the resin, removing the second contact layer and forming a second groove separating pixels.

DETAILED DESCRIPTION

Figure 1:
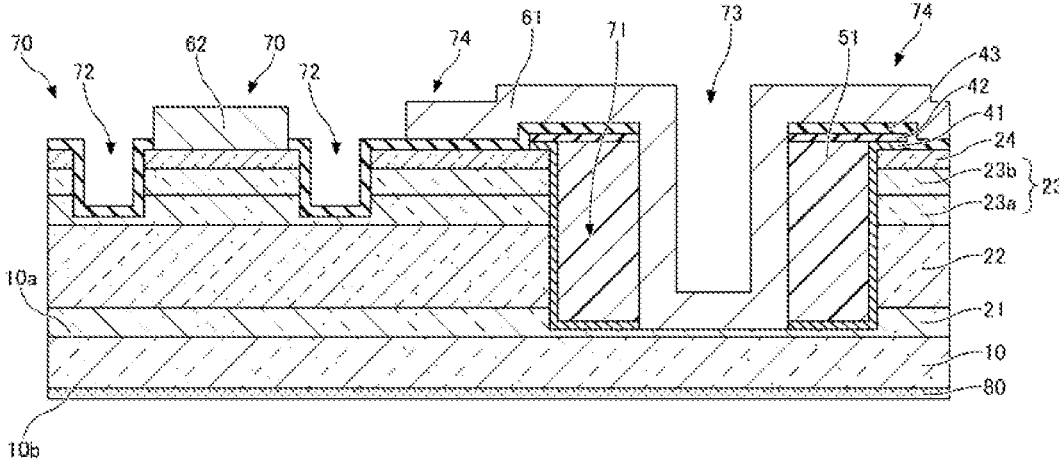
FIG. 1 is a cross-sectional view illustrating a light-receiving element according to an embodiment.

In conventional light-receiving elements, mesa interface damage in the pixel area caused by the deposition of SiN film or $SiO_2$ film for the etching mask to form the mesa of the electrode extraction part remains, resulting in a large leakage current.

It is an object of the present disclosure to provide a method of manufacturing a light-receiving element and a light-receiving element in which leakage current can be reduced.

Modes for carrying out the invention will be described below.

Description of Embodiments of Present Disclosure

First, embodiments of the present disclosure will be listed and explained. In the following description, identical or corresponding elements are provided with the same reference signs and will not be described repeatedly.

(1) A method of manufacturing a light-receiving element according to an embodiment of the present disclosure includes forming a first contact layer at one surface of a substrate, forming a light receiving layer on the first contact layer, forming a second contact layer on the light receiving layer, removing a portion of each of the second contact layer, the light receiving layer, and the first contact layer and forming a first groove at which the first contact layer is exposed, filling the first groove with a resin, and after filling the first groove with the resin, removing the second contact layer and forming a second groove separating pixels. In this case, when the SiN film or the $SiO_2$ film for the etching mask for forming the first groove is deposited, the side surface of the mesa for forming the pixel is not exposed. Therefore, it is possible to reduce damage to the side surface of the mesa during deposition of the SiN film or the $SiO_2$ film for the etching mask for forming the first groove. As a result, the leakage current can be reduced.

(2) In (1), the method may further include between filling the first groove with the resin and forming the second groove, forming an electrically insulating film on the resin. In this case, it is easy to suppress the etching of the resin when removing the etching mask used for forming the second groove.

(3) In (1) or (2), the method may further include after forming the second groove, removing a damaged layer. In this case, a damaged layer generated when the second groove is formed can be removed.

(4) In (1) to (3), the resin may be a benzocyclobutene resin or a polyimide resin. In this case, the resin can be easily filled in the first groove by coating.

(5) A light-receiving element according to another embodiment of the present disclosure includes a substrate, a first contact layer provided at one surface of the substrate, a light receiving layer provided on the first contact layer, a second contact layer provided on the light receiving layer, a first groove at which a portion of each of the second contact layer, the light receiving layer, and the first contact layer is removed and at which the first contact layer is exposed, a resin provided in a portion of an inside of the first groove, and a second groove at which the second contact layer is removed and separating pixels. In this case, the second groove for pixel separation can be formed later than the first groove for electrode extraction. Accordingly, when an SiN film or an $SiO_2$ film for the etching mask for forming the first groove is deposited, the side surface of the mesa for forming the pixel is not exposed. Therefore, it is possible to reduce damage to the side surface of the mesa during deposition of the SiN film or the $SiO_2$ film for the etching mask for forming the first groove. As a result, the leakage current can be reduced.

Details of Embodiments of Present Disclosure

Embodiments of the present disclosure present disclosure will be described in detail, but the present disclosure is not limited thereto.

(Light-Receiving Element)

Figure 2:
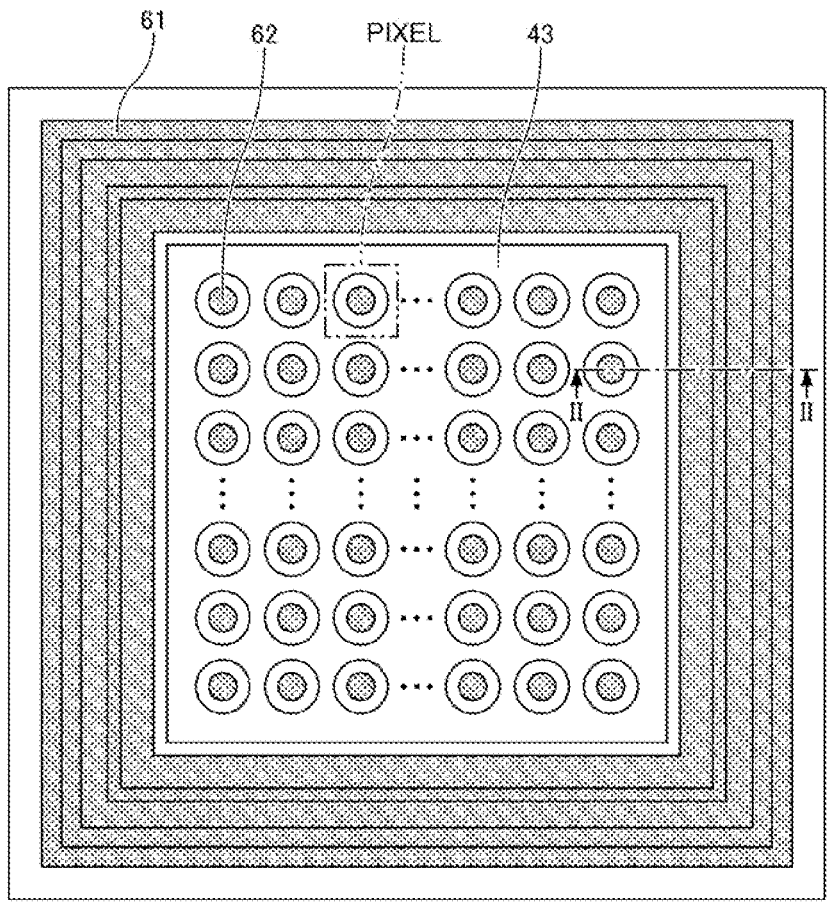
FIG. 2 is a top view illustrating a light-receiving element according to the embodiment.

Referring to FIGS. 1 and 2, a light-receiving element 100 according to an embodiment will be described. FIG. 1 is a cross-sectional view illustrating light-receiving element 100 according to the embodiment. FIG. 2 is a top view of light-receiving element 100 according to the embodiment. FIG. 1 is a cross-sectional view taken along line II-II of FIG. 2. Light-receiving element 100 is a light-receiving element that detects near-infrared light. Light-receiving element 100 is a so-called back-surface incident light-receiving element. As shown in FIG. 1, light-receiving element 100 includes a substrate 10.

Substrate 10 is, for example, an InP substrate. Substrate 10 is doped with Fe (iron) as an impurity element and is semi-insulating. The thickness of substrate 10 is, for example, 500 μm to 700 μm. Substrate 10 has, for example, a rectangular shape with a side length of 2 mm to 15 mm. Substrate 10 has a first main surface 10a and a second main surface 10b opposite to first main surface 10a. On first main surface 10a, an n-type contact layer (first contact layer) 21, a light receiving layer 22, a wide gap layer 23, and a p-type contact layer (second contact layer) 24 are provided in this order. An anti-reflection film 80 is provided on second main surface 10b. Anti-reflection film 80 is formed of, for example, an SiN film.

N-type contact layer 21 is provided on substrate 10. N-type contact layer 21 is formed of n-InP and is doped with silicon (Si) as an n-type impurity element at a concentration of about $2 \times 10^{18}$ $cm^{-3}$. The thickness of n-type contact layer 21 is, for example, 1 μm to 3 μm.

Light receiving layer 22 is provided on n-type contact layer 21. Light receiving layer 22 is formed of $In_{0.53}Ga_{0.47}As$ which is not doped with an impurity element. The thickness of light receiving layer 22 is, for example, 1 μm to 3 μm.

Wide gap layer 23 is provided on light receiving layer 22. Wide gap layer 23 includes, for example, an n-type wide gap layer 23a and a p-type wide gap layer 23b. N-type wide gap layer 23a is formed of n-InP and doped with Si as an n-type impurity element at a concentration of about $2 \times 10^{15}$ $cm^{-3}$. The thickness of n-type wide gap layer 23a is, for example, 0.2 μm to 0.8 μm. P-type wide gap layer 23b is formed of p-InP and is doped with Zinc (Zn) at a concentration of about $2 \times 10^{15}$ $cm^{-3}$ as a p-type impurity element. The thickness of p-type wide gap layer 23b is, for example, 0.1 μm to 0.5 μm. A PN junction is formed at an interface between n-type wide gap layer 23a and p-type wide gap layer 23b.

P-type contact layer 24 is provided on wide gap layer 23. P-type contact layer 24 is formed of p-InGaAs and is doped with Zn as a p-type impurity element at a concentration of about $1 \times 10^{19}$ $cm^{-3}$. The thickness of p-type contact layer 24 is, for example, 0.1 μm to 0.3 μm.

In light-receiving element 100, a groove 71 for electrode extraction and a groove 72 for pixel separation are formed.

Groove 71 is formed by removing a portion of each of p-type contact layer 24, wide gap layer 23, light receiving layer 22, and n-type contact layer 21. Groove 71 is formed along the outer periphery. N-type contact layer 21 is exposed at the bottom surface of groove 71, and n-type contact layer 21, light receiving layer 22, n-type wide gap layer 23a, p-type wide gap layer 23b, and p-type contact layer 24 are exposed at the side surface of groove 71. A first passivation film 41 is provided on exposed n-type contact layer 21 and on the side surfaces of n-type contact layer 21, light receiving layer 22, n-type wide gap layer 23a, p-type wide gap layer 23b, and the p-type contact layer. First passivation film 41 is formed of, for example, an SiN film having a thickness of 100 nm to 400 nm. Inside groove 71 is filled with a resin 51. Resin 51 may be benzocyclobutene (BCB) or polyimide resin, for example. A second passivation film 42 and a third passivation film 43 are provided in this order on resin 51.

When viewed in a direction perpendicular to first main surface 10a, light-receiving element 100 is provided with a groove 73 whose portion overlaps with groove 71. Groove 73 is formed by removing third passivation film 43, second passivation film 42, resin 51, and first passivation film 41. Groove 73 is formed along the outer periphery. N-type contact layer 21 is exposed at the bottom surface of groove 73, and first passivation film 41, resin 51, second passivation film 42, and third passivation film 43 are exposed at the side surface. An n-electrode 61 is formed on the exposed n-type contact layer 21, on the side surfaces of first passivation film 41, resin 51, second passivation film 42, and third passivation film 43, and on third passivation film 43. N-electrode 61 is formed of, for example, a stacked film of a titanium (Ti) film, a platinum (Pt) film, and a gold (Au) film.

Groove 72 is formed by removing a portion of each of p-type contact layer 24 and wide gap layer 23. N-type wide gap layer 23a is exposed at the bottom surface of groove 72. Each pixel is formed with a mesa 70 separated by groove 72. A p-electrode 62 is formed on p-type contact layer 24 in mesa 70. P-electrode 62 is formed of, for example, a stacked film of a Ti film, a Pt film, and an Au film. Third passivation film 43 is provided on the exposed p-type contact layer 24 and on the side surfaces of wide gap layer 23 and p-type contact layer 24. A side surface of the PN junction of wide gap layer 23 is in contact with third passivation film 43. Third passivation film 43 is formed of, for example, an SiN film having a thickness of 100 nm to 400 nm.

As described above, light-receiving element 100 according to the embodiment has a structure in which the inside portion of groove 71 for electrode extraction is filled with resin 51 and groove 72 for pixel separation is not filled with resin 51. In this case, groove 72 for pixel separation can be formed later than groove 71 for electrode extraction. Accordingly, when the SiN film or the SiO₂ film for the etching mask for forming groove 71 is deposited, the side surface of mesa 70 for forming the pixel is not exposed. Therefore, it is possible to reduce damage to the side surface of mesa 70 at the time of the deposition of the SiN film or the SiO₂ film for the etching mask for forming groove 71. As a result, the leakage current can be reduced.
(Manufacturing Method of Light-Receiving Element)

A method of manufacturing light-receiving element 100 according to the embodiment will be described with reference to FIGS. 3 to 29.

Figure 3:
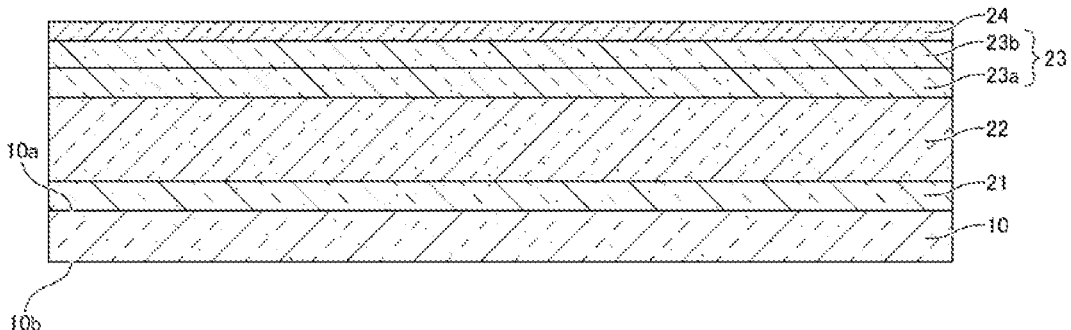
FIG. 3 is a cross-sectional view (part 1) illustrating a method of manufacturing a light-receiving element according to the embodiment.

First, as shown in FIG. 3, n-type contact layer 21, light receiving layer 22, wide gap layer 23, and p-type contact layer 24 are formed in this order on first main surface 10a of substrate 10 by epitaxial growth.

Substrate 10 is, for example, an InP substrate. Substrate 10 is doped with Fe as an impurity element and is semi-insulating. The thickness of substrate 10 is, for example, 500 μm to 700 μm.

N-type contact layer 21 is formed of n-InP and is doped with Si as an n-type impurity element at a concentration of about $2 \times 10^{18}$ cm$^{-3}$. The thickness of n-type contact layer 21 is, for example, 1 μm to 3 μm.

Light receiving layer 22 is formed of $In_{0.53}Ga_{0.47}As$ which is not doped with an impurity element. The thickness of light receiving layer 22 is, for example, 1 μm to 3 μm.

Wide gap layer 23 includes, for example, n-type wide gap layer 23a and p-type wide gap layer 23b. N-type wide gap layer 23a is formed of n-InP and doped with Si as an n-type impurity element at a concentration of about $2 \times 10^{15}$ cm$^{-3}$. The thickness of n-type wide gap layer 23a is, for example, 0.2 μm to 0.8 μm. P-type wide gap layer 23b is formed of p-InP and doped with Zn as a p-type impurity element at a concentration of about $2 \times 10^{15}$ cm$^{-3}$. The thickness of p-type wide gap layer 23b is, for example, 0.1 μm to 0.5 μm. A PN junction is formed at an interface between n-type wide gap layer 23a and p-type wide gap layer 23b.

P-type contact layer 24 is formed of p-InGaAs and is doped with Zn as a p-type impurity element at a concentration of about $1 \times 10^{19}$ cm$^{-3}$. The thickness of p-type contact layer 24 is, for example, 0.1 μm to 0.3 μm.

Figure 4:
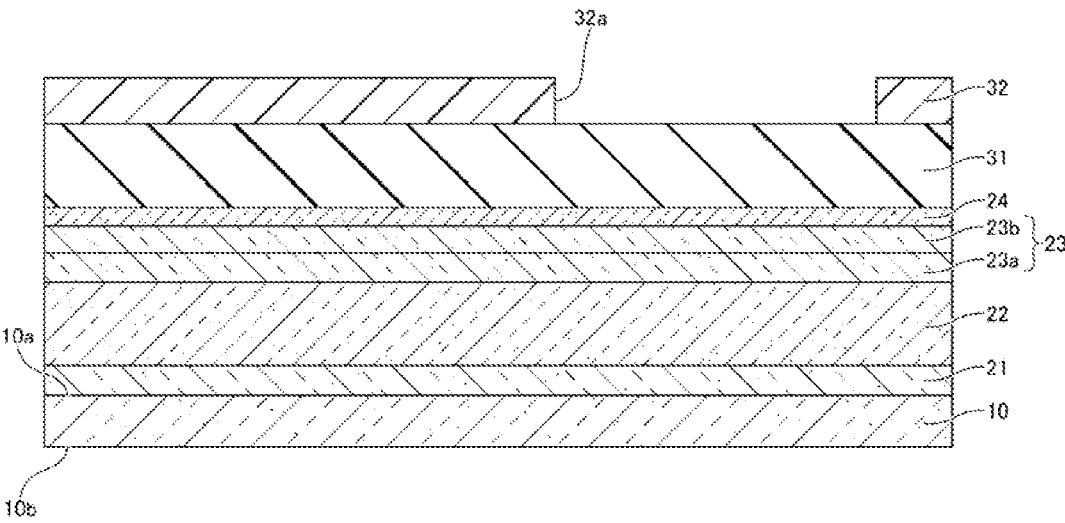
FIG. 4 is a cross-sectional view (part 2) illustrating a method of manufacturing a light-receiving element according to the embodiment.

Next, groove 71 for electrode extraction is formed along the outer periphery of substrate 10. First, as shown in FIG. 4, an SiN film 31 is deposited on p-type contact layer 24 using plasma CVD (chemical vapor deposition). The thickness of SiN film 31 is, for example, 0.6 μm to 2 μm. An SiO₂ film may be used instead of SiN film 31. Thereafter, a photoresist is applied onto deposited SiN film 31, and exposure and development are performed with an exposure device to form a resist pattern 32. The thickness of resist pattern 32 is, for example, 1 μm to 4 μm. Resist pattern 32 has an opening portion 32a in a region where groove 71 is formed.

Figure 5:
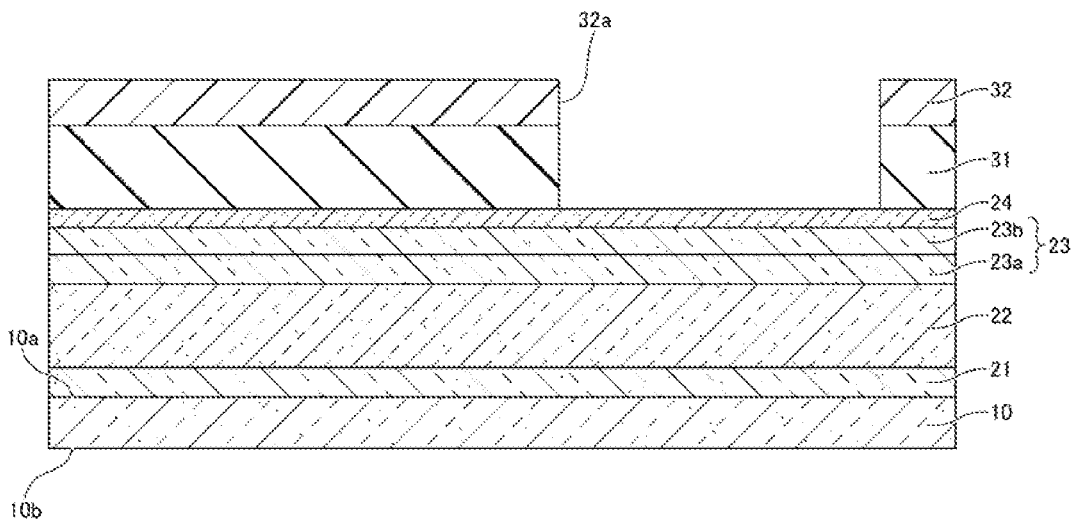
FIG. 5 is a cross-sectional view (part 3) illustrating a method of manufacturing a light-receiving element according to the embodiment.

Next, as shown in FIG. 5, SiN film 31 in opening portion 32a of resist pattern 32 is removed by dry etching using a fluorine-based gas to form an etching mask with SiN film 31. The fluorine-based gas is, for example, CF₄ gas or SF₆ gas.

Figure 6:
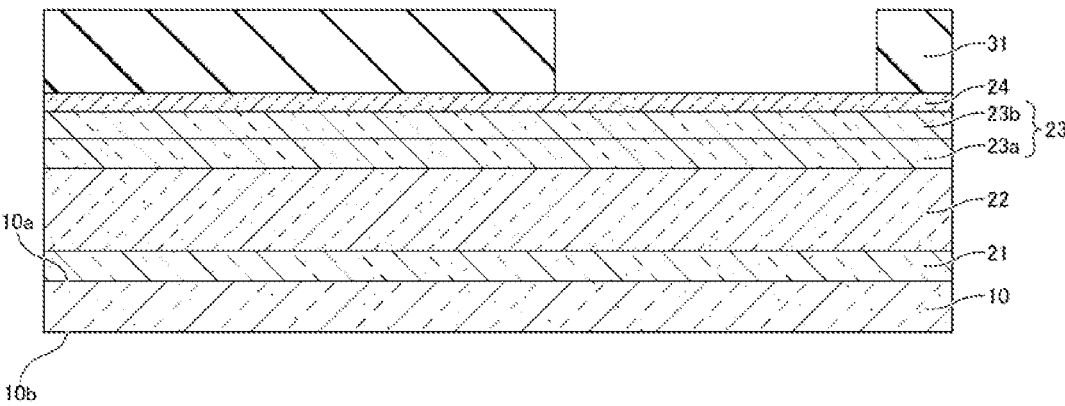
FIG. 6 is a cross-sectional view (part 4) illustrating a method of manufacturing a light-receiving element according to the embodiment.

Next, as shown in FIG. 6, resist pattern 32 is removed with an organic solvent or the like.

Figure 7:
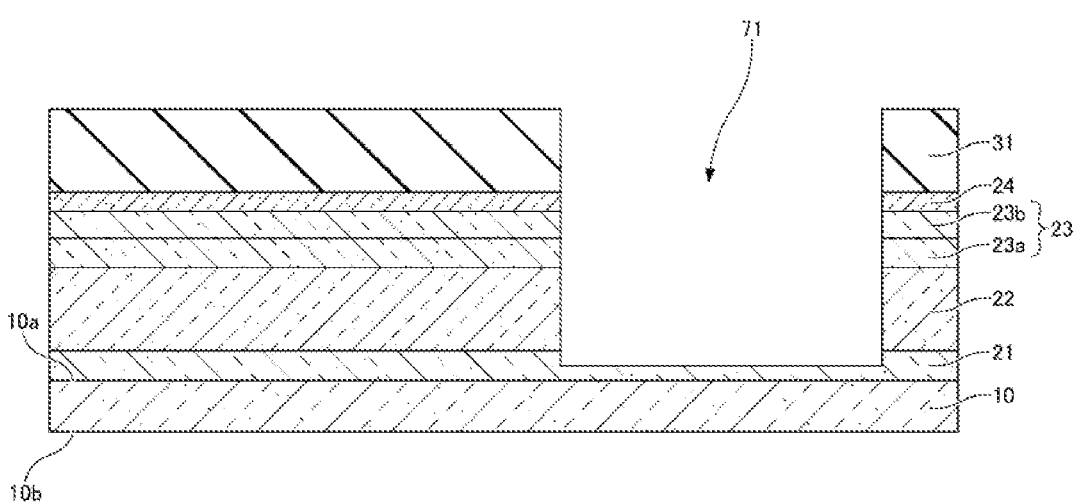
FIG. 7 is a cross-sectional view (part 5) illustrating a method of manufacturing a light-receiving element according to the embodiment.

Next, as shown in FIG. 7, a portion of each of p-type contact layer 24, p-type wide gap layer 23b, n-type wide gap layer 23a, light receiving layer 22, and n-type contact layer 21 in the region where SiN film 31 has been removed is removed by dry etching using a halogen-based gas to form groove 71. N-type contact layer 21 is exposed at the bottom surface of groove 71, and n-type contact layer 21, light receiving layer 22, n-type wide gap layer 23a, p-type wide gap layer 23b, and p-type contact layer 24 are exposed at the side surface of groove 71. A damaged layer (not shown) may be formed on the exposed surfaces of n-type contact layer 21, light receiving layer 22, n-type wide gap layer 23a, p-type wide gap layer 23b, and p-type contact layer 24 by dry etching. The halogen-based gas is, for example, Cl₂ gas or SiCl₄ gas.

Figure 8:
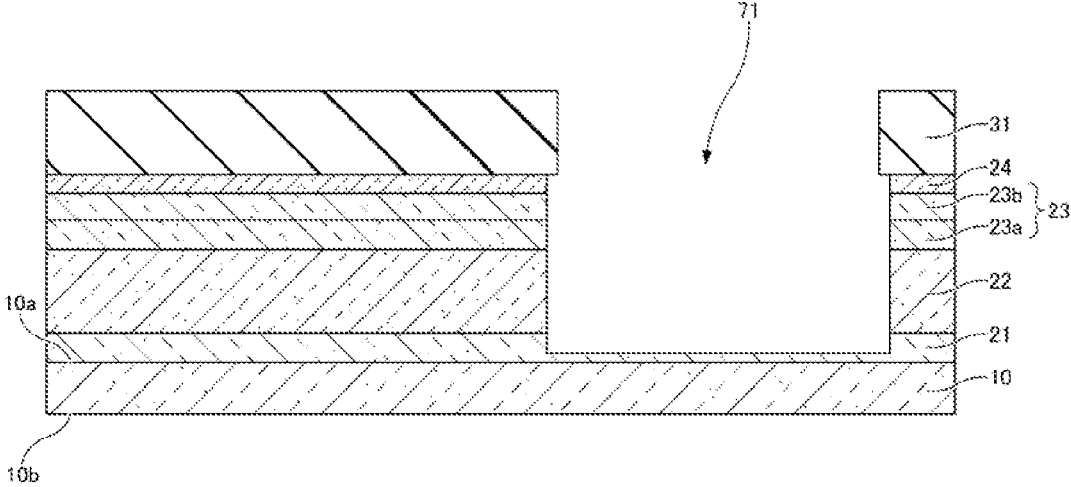
FIG. 8 is a cross-sectional view (part 6) illustrating a method of manufacturing a light-receiving element according to the embodiment.

Next, as shown in FIG. 8, the damaged layer generated when groove 71 is formed is removed with a hydrochloric acid-based etchant. In this case, a damaged layer generated when groove 71 is formed can be removed. At this time, n-type contact layer 21 is left on the bottom surface of groove 71. The hydrochloric acid-based etchant is, for example, HCl.

Figure 9:
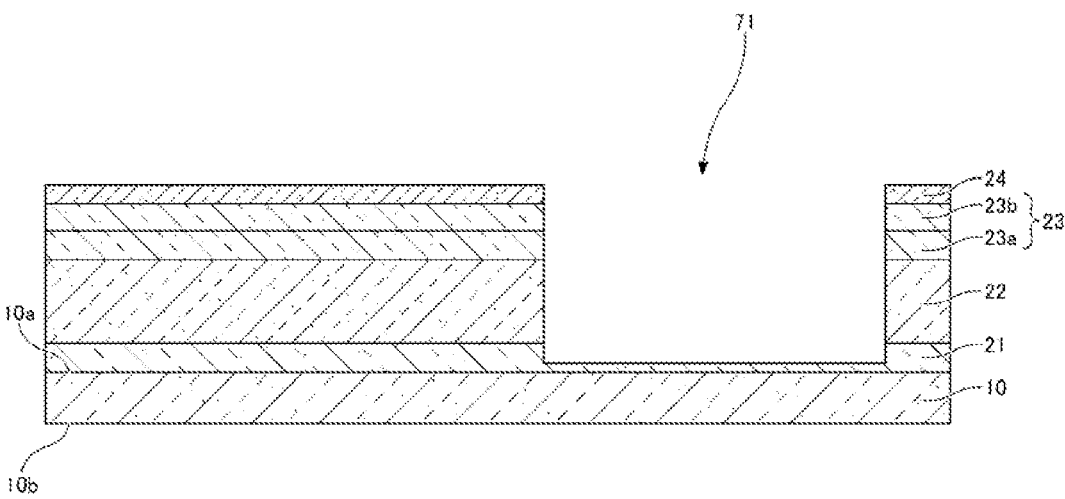
FIG. 9 is a cross-sectional view (part 7) illustrating a method of manufacturing a light-receiving element according to the embodiment.

Next, as shown in FIG. 9, SiN film 31 is removed by wet etching using buffered hydrofluoric acid.

Figure 10:
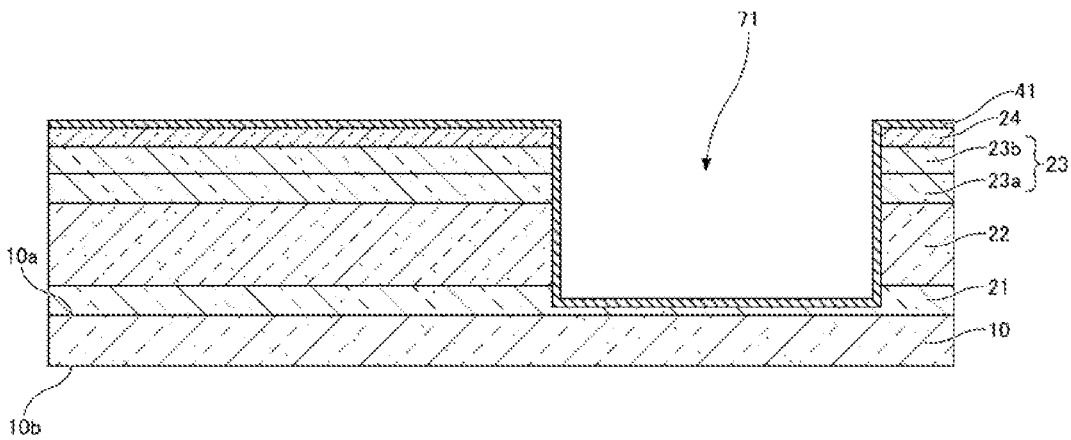
FIG. 10 is a cross-sectional view (part 8) illustrating a method of manufacturing a light-receiving element according to the embodiment.

Next, as shown in FIG. 10, first passivation film 41 is deposited on p-type contact layer 24 and on the bottom surface and the side surface of groove 71 using plasma CVD. First passivation film 41 is, for example, an SiN film. An $SiO_2$ film may be used instead of the SiN film. The thickness of first passivation film 41 is, for example, 100 nm to 400 nm.

Figure 11:
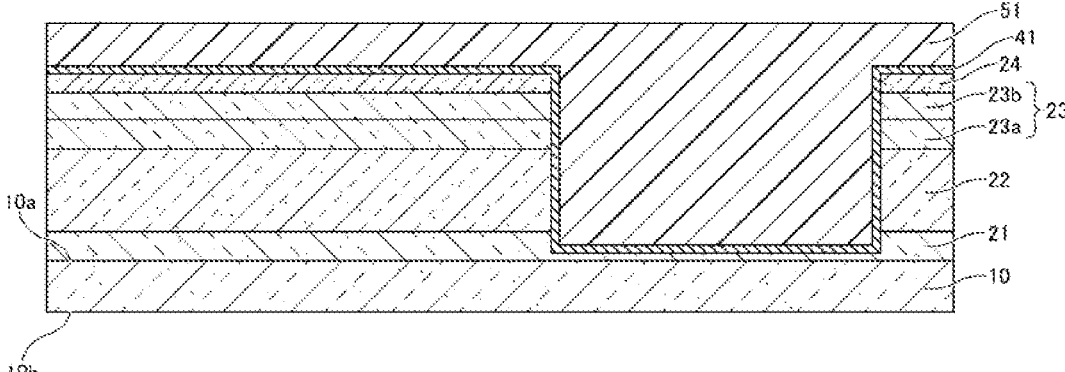
FIG. 11 is a cross-sectional view (part 9) illustrating a method of manufacturing a light-receiving element according to the embodiment.

Next, as shown in FIG. 11, resin 51 is applied onto first passivation film 41 by spin coating to fill groove 71 with resin 51. At this time, groove 71 is completely filled with resin 51. Thereafter, resin 51 is thermally cured. Resin 51 may be, for example, a BCB resin or a polyimide resin. In this case, it is easy to fill groove 71 with resin 51 by coating.

Figure 12:
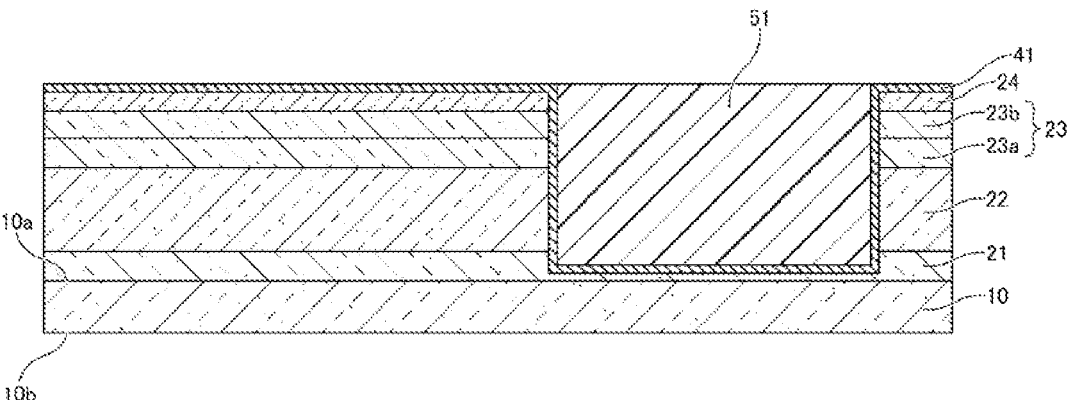
FIG. 12 is a cross-sectional view (part 10) illustrating a method of manufacturing a light-receiving element according to the embodiment.

Next, as shown in FIG. 12, resin 51 on p-type contact layer 24 is removed by dry etching using a mixed gas of a fluorine-based gas and an oxygen gas to expose first passivation film 41. As a result, the upper surface of first passivation film 41 and the upper surface of resin 51 become flush or almost flush. The fluorine-based gas is, for example, $CF_4$ gas or $SF_6$ gas.

Figure 13:
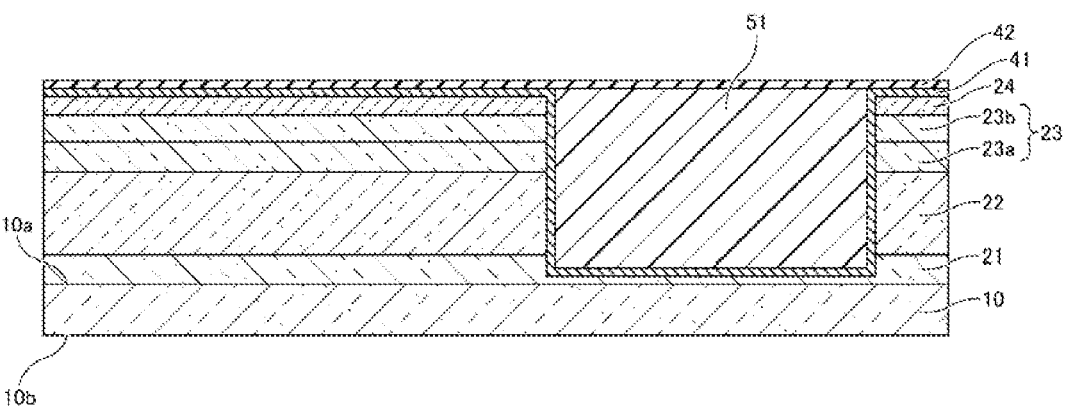
FIG. 13 is a cross-sectional view (part 11) illustrating a method of manufacturing a light-receiving element according to the embodiment.

Next, as shown in FIG. 13, second passivation film 42 is formed on first passivation film 41 and resin 51 using plasma CVD. In this case, it is easy to suppress the etching of resin 51 when removing an SiN film 34 for the etching mask used when forming groove 72. Second passivation film 42 is, for example, an SiN film. An $SiO_2$ film may be used instead of the SiN film. The thickness of second passivation film 42 is, for example, 50 nm to 200 nm.

Figure 14:
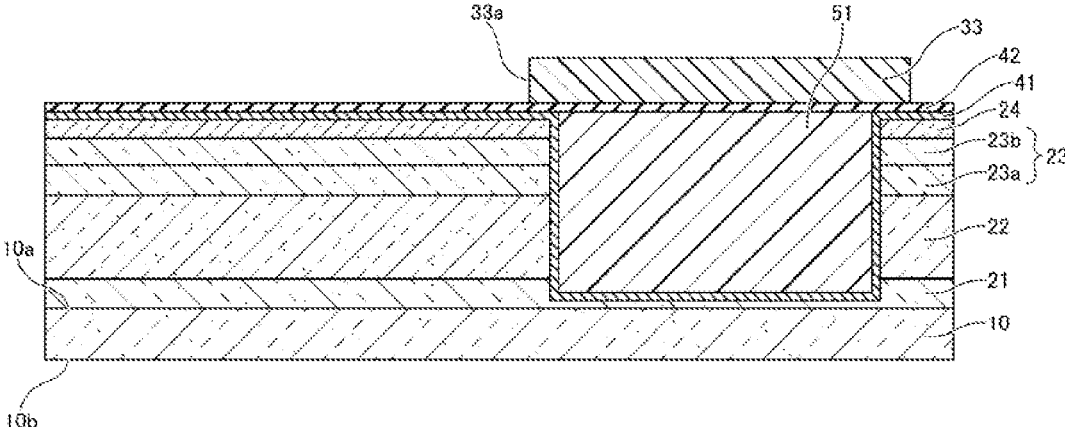
FIG. 14 is a cross-sectional view (part 12) illustrating a method of manufacturing a light-receiving element according to the embodiment.

Next, as shown in FIG. 14, a photoresist is applied on second passivation film 42, and exposure and development are performed with an exposure device to form a resist pattern 33. The thickness of resist pattern 33 is, for example, 1 μm to 2 μm. Resist pattern 33 has an opening portion 33a in a region other than groove 71.

Figure 15:
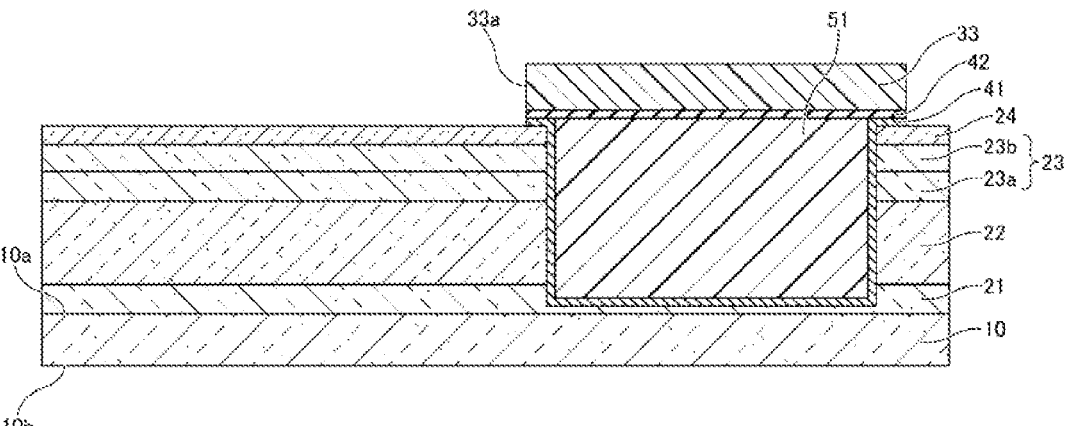
FIG. 15 is a cross-sectional view (part 13) illustrating a method of manufacturing a light-receiving element according to the embodiment.

Next, as shown in FIG. 15, first passivation film 41 and second passivation film 42 in opening portion 33a of resist pattern 33 are removed by wet etching using buffered hydrofluoric acid.

Figure 16:
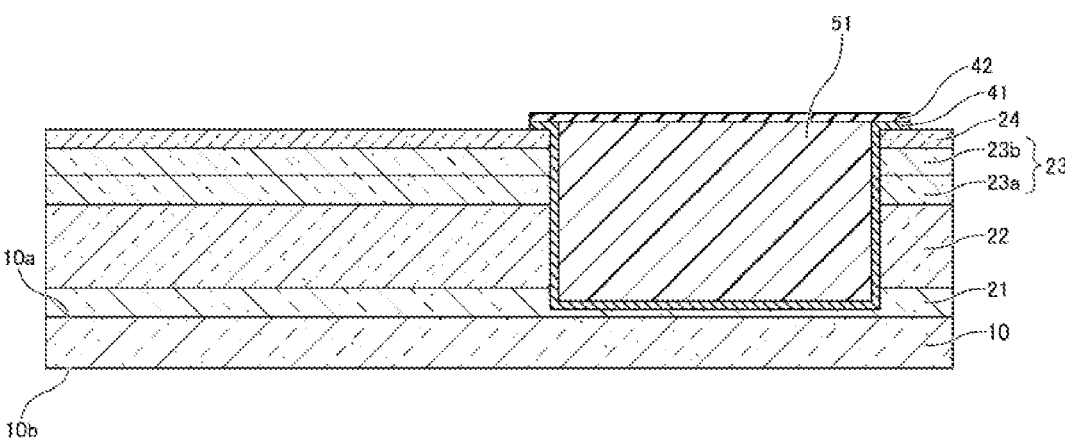
FIG. 16 is a cross-sectional view (part 14) illustrating a method of manufacturing a light-receiving element according to the embodiment.

Next, as shown in FIG. 16, resist pattern 33 is removed with an organic solvent or the like.

Figure 17:
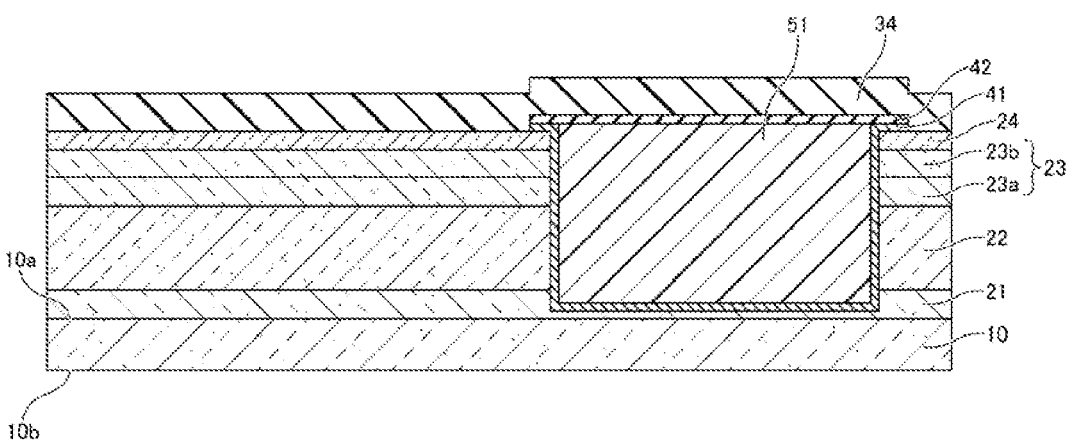
FIG. 17 is a cross-sectional view (part 15) illustrating a method of manufacturing a light-receiving element according to the embodiment.

Next, groove 72 for pixel separation is formed. First, as shown in FIG. 17, SiN film 34 is deposited using plasma CVD on p-type contact layer 24, on the side surface of first passivation film 41, and on the top surface and the side surface of second passivation film 42. The etching rate of SiN film 34 with respect to, for example, buffered hydrofluoric acid is higher than those of first passivation film 41 and second passivation film 42. For example, by setting the film deposition temperature of SiN film 34 to be lower than the film deposition temperatures of first passivation film 41 and second passivation film 42, it is possible to deposit SiN film 34 whose etching rate with respect to buffered hydrofluoric acid is higher than those of first passivation film 41 and second passivation film 42. SiN film 34 may be, for example, a film having an etching rate with respect to buffered hydrofluoric acid that is twice or more than twice those of first passivation film 41 and the second passivation film. An $SiO_2$ film may be used instead of SiN film 34.

Figure 18:
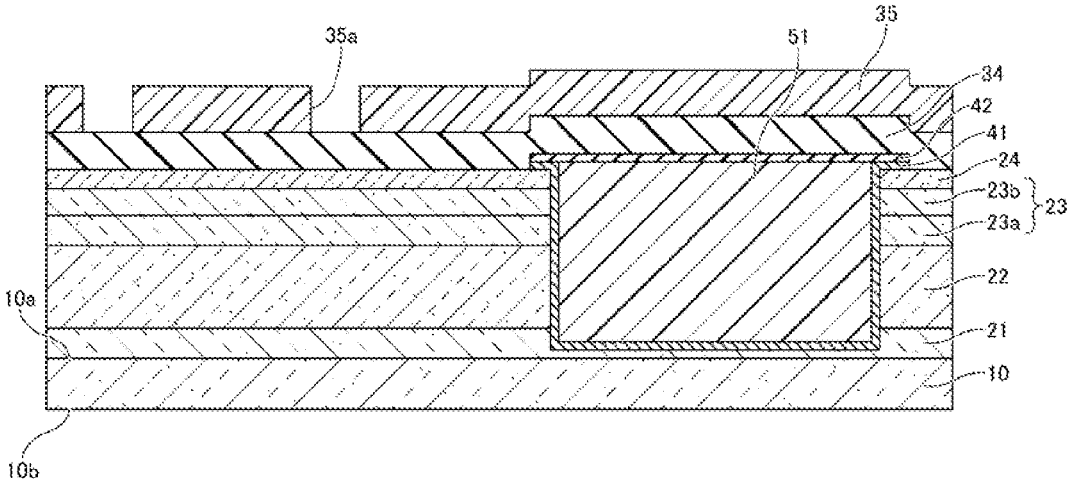
FIG. 18 is a cross-sectional view (part 16) illustrating a method of manufacturing a light-receiving element according to the embodiment.

Next, as shown in FIG. 18, a photoresist is applied on SiN film 34, and exposure and development are performed with an exposure device to form a resist pattern 35. At this time, since groove 71 is filled with resin 51, thin resist pattern 35 can be used. Therefore, an opening portion 35a can be formed with high dimensional accuracy. As a result, mesa 70 separated by groove 72 to form a pixel can be formed with high dimensional accuracy. On the other hand, when groove 71 is not filled with resin 51, it is necessary to apply the photoresist so as to cover the bottom surface and the side surface of groove 71. Therefore, it is difficult to form the opening portion in the photoresist with high dimensional accuracy. The thickness of resist pattern 35 is, for example, 1 μm to 2 μm. Resist pattern 35 has opening portion 35a in a region where groove 72 is formed.

Figure 19:
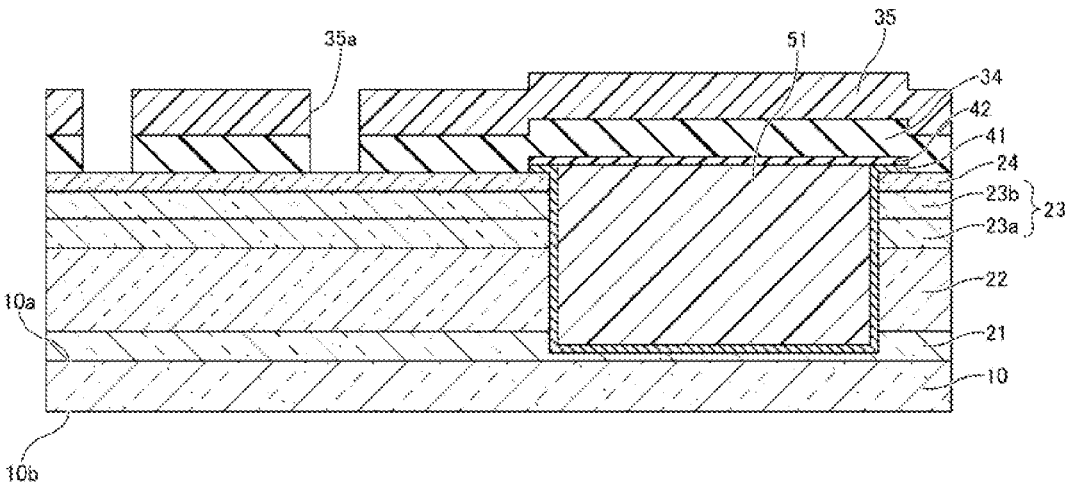
FIG. 19 is a cross-sectional view (part 17) illustrating a method of manufacturing a light-receiving element according to the embodiment.

Next, as shown in FIG. 19, SiN film 34 in opening portion 35a of resist pattern 35 is removed by dry etching using a fluorine-based gas to form an etching mask by SiN film 34. The fluorine-based gas is, for example, $CF_4$ gas or $SF_6$ gas.

Figure 20:
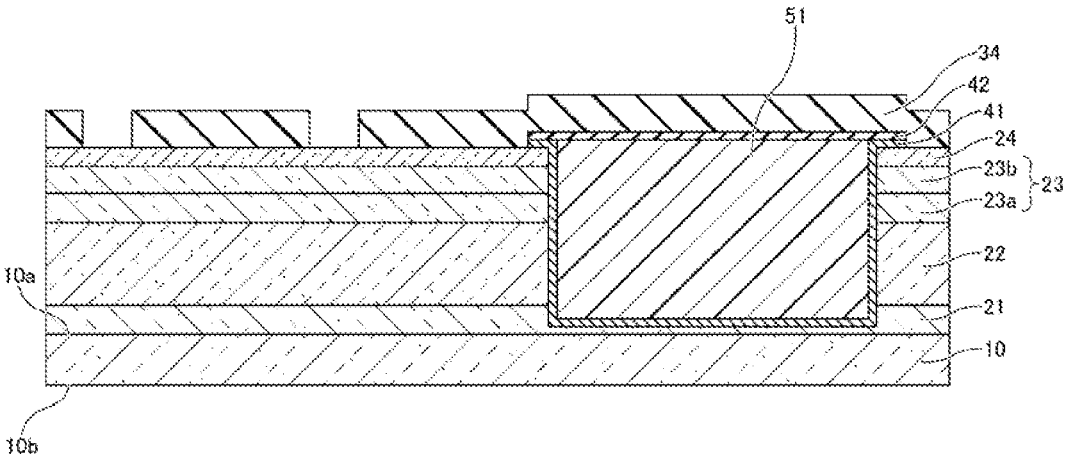
FIG. 20 is a cross-sectional view (part 18) illustrating a method of manufacturing a light-receiving element according to the embodiment.

Next, as shown in FIG. 20, resist pattern 35 is removed with an organic solvent or the like.

Figure 21:
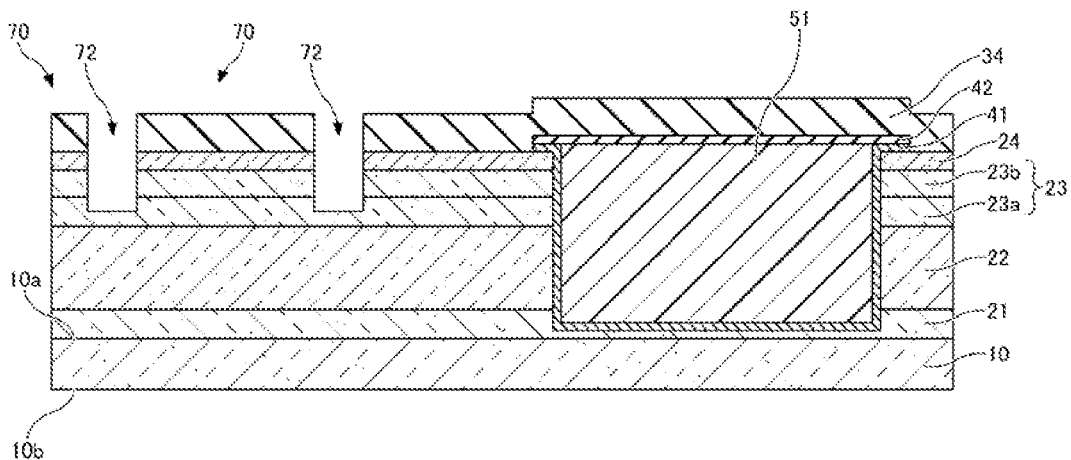
FIG. 21 is a cross-sectional view (part 19) illustrating a method of manufacturing a light-receiving element according to the embodiment.

Next, as shown in FIG. 21, a portion of each of p-type contact layer 24, p-type wide gap layer 23b, and n-type wide gap layer 23a in the region where SiN film 34 has been removed are removed by dry etching using a halogen-based gas to form groove 72. N-type wide gap layer 23a is exposed at the bottom surface of groove 72, and n-type wide gap layer 23a, p-type wide gap layer 23b, and p-type contact layer 24 are exposed at the side surface of groove 72. Each pixel is formed with mesa 70 separated by groove 72. A damaged layer (not shown) may be formed on the exposed surfaces of n-type wide gap layer 23a, p-type wide gap layer 23b, and p-type contact layer 24 by dry etching. The halogen-based gas is, for example, $Cl_2$ gas or $SiCl_4$ gas.

Figure 22:
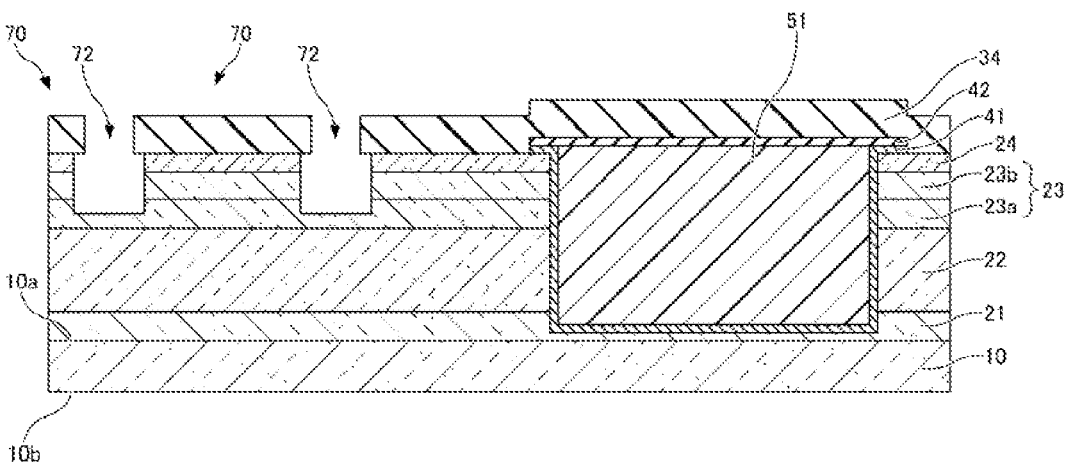
FIG. 22 is a cross-sectional view (part 20) illustrating a method of manufacturing a light-receiving element according to the embodiment.

Next, as shown in FIG. 22, the damaged layer generated when groove 72 is formed is removed with a hydrochloric acid-based etchant. In this case, a damaged layer generated when groove 72 is formed can be removed. At this time, n-type wide gap layer 23a is left on the bottom surface of groove 72. The hydrochloric acid-based etchant is, for example, HCl.

Figure 23:
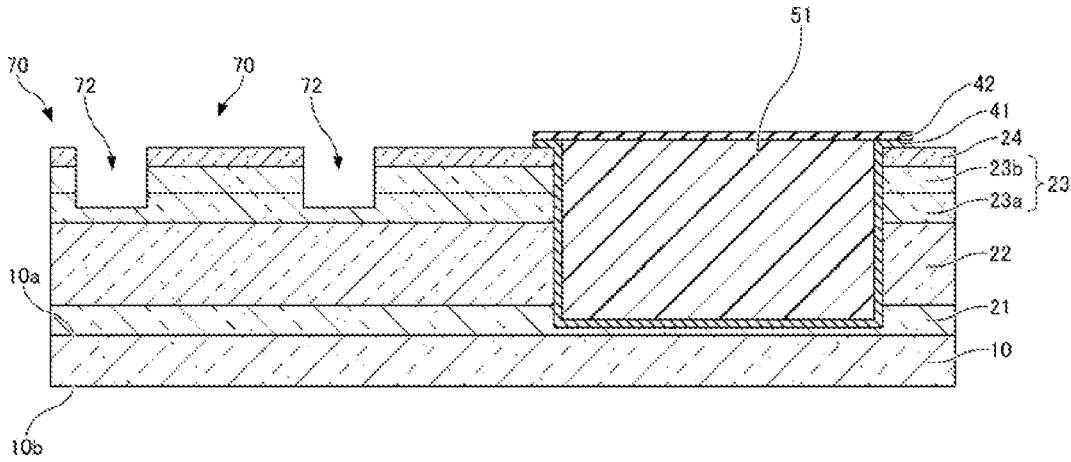
FIG. 23 is a cross-sectional view (part 21) illustrating a method of manufacturing a light-receiving element according to the embodiment.

Next, as shown in FIG. 23, SiN film 34 is removed by wet etching using buffered hydrofluoric acid. At this time, first passivation film 41 formed on the bottom surface and the side surface of groove 71 and second passivation film 42 formed on resin 51 are left. For example, when SiN film 34 is a film having an etching rate with respect to buffered hydrofluoric acid that is twice or more than twice those of first passivation film 41 and second passivation film 42, it is easy to leave second passivation film 42 even considering overetching.

Figure 24:
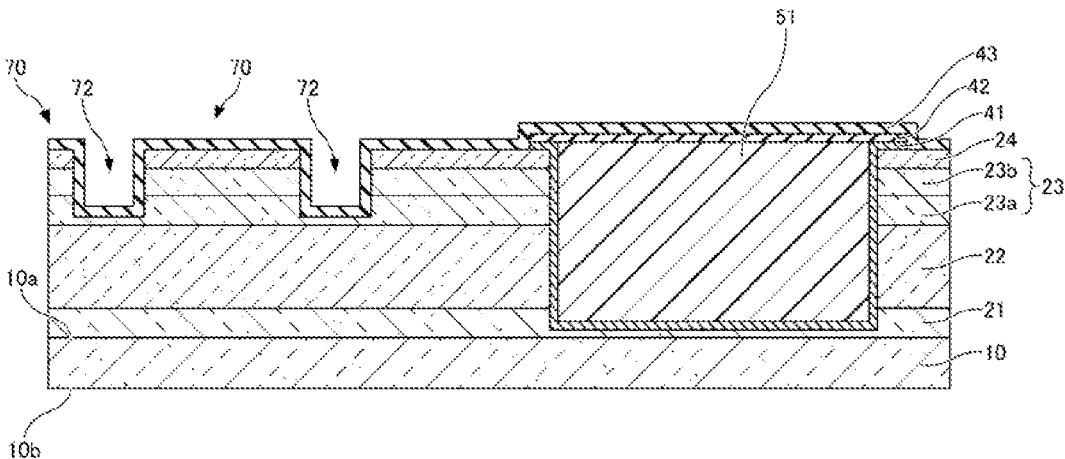
FIG. 24 is a cross-sectional view (part 22) illustrating a method of manufacturing a light-receiving element according to the embodiment.

Next, as shown in FIG. 24, third passivation film 43 is deposited using plasma CVD on p-type contact layer 24, on the side surface of first passivation film 41, and the top surface and the side surface of second passivation film 42, and the bottom surface and the side surface of groove 72. At this time, third passivation film 43 can be deposited in a state where the damaged layer on the exposed surfaces of n-type wide gap layer 23a, p-type wide gap layer 23b, and p-type contact layer 24 is removed and there is no damage, so that leakage current can be reduced. On the other hand, when groove 71 for electrode extraction are formed after groove 72 for forming the pixels are formed, an SiN film or an $SiO_2$ film for an etching mask for forming groove 71 is deposited after the damaged layer is removed. Therefore, when the SiN film or the $SiO_2$ film for the etching mask is deposited, the side surface (the exposed surface of n-type wide gap layer 23a, p-type wide gap layer 23b, and p-type contact layer 24) of mesa 70 forming the pixel is damaged, and the generated damage remains. As a result, the leakage current increases. If the damaged layer is removed after groove 71 is formed and before the passivation film covering groove 72 is deposited, since the upper surface of mesa 70 is exposed, a portion or the whole of p-type contact layer 24 is etched, so that the damaged layer cannot be removed. Third passivation film 43 is, for example, an SiN film. An $SiO_2$ film may be used instead of the SiN film. The thickness of third passivation film 43 is, for example, 100 nm to 400 nm.

Figure 25:
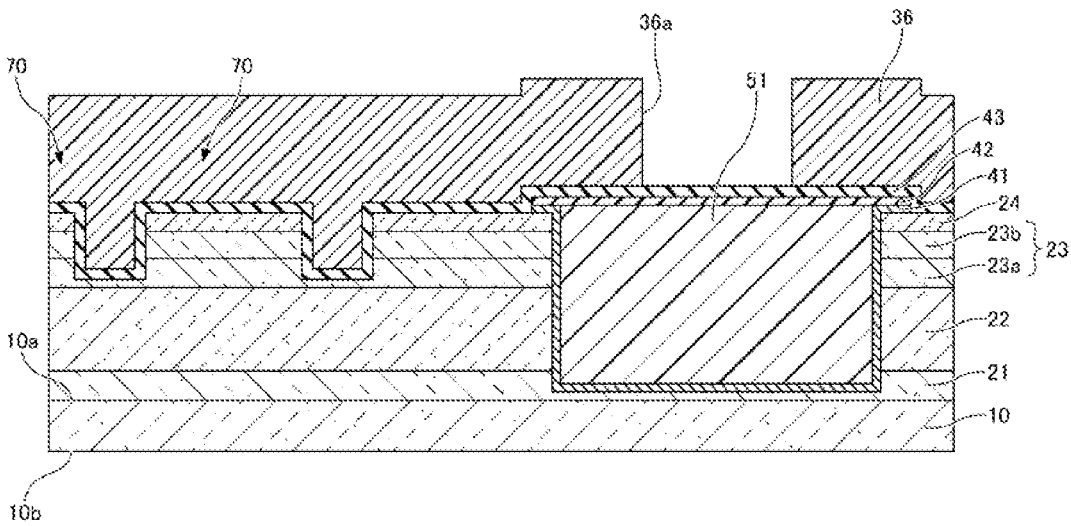
FIG. 25 is a cross-sectional view (part 23) illustrating a method of manufacturing a light-receiving element according to the embodiment.

Next, as shown in FIG. 25, a photoresist is applied on third passivation film 43, and exposure and development are performed with an exposure device to form a resist pattern 36. Resist pattern 36 has an opening portion 36a in a region where n-electrode 61 is formed. When viewed from a direction orthogonal to first main surface 10a, for example, opening portion 36a is formed at a position overlapping at least a portion of the region where resin 51 is provided. The width of opening portion 36a may be narrower than the width of groove 71, for example.

Figure 26:
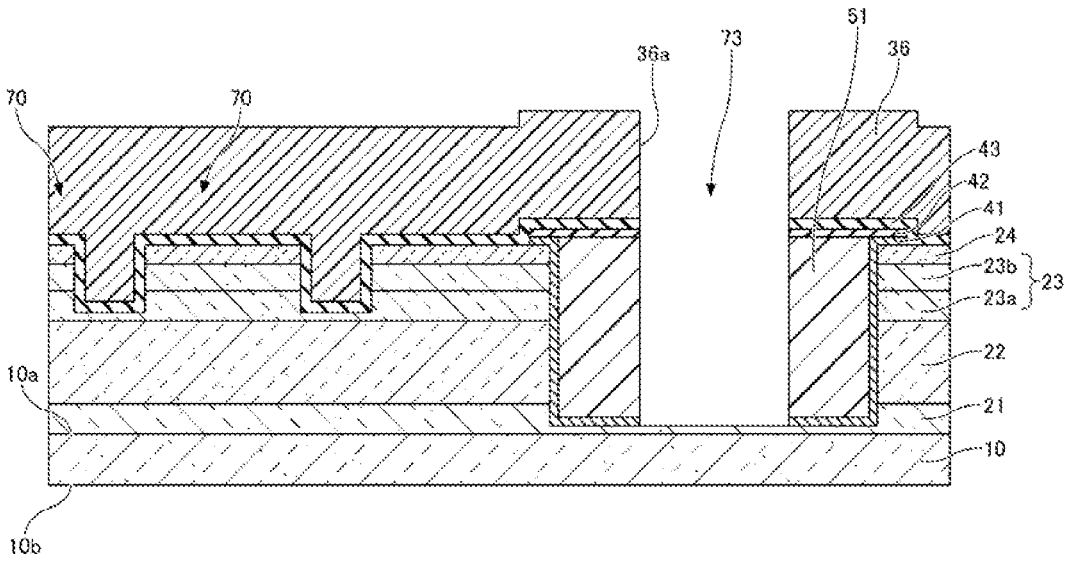
FIG. 26 is a cross-sectional view (part 24) illustrating a method of manufacturing a light-receiving element according to the embodiment.

Next, as shown in FIG. 26, third passivation film 43, second passivation film 42, resin 51, and first passivation film 41 in opening portion 36a of resist pattern 36 are removed by dry etching using a fluorine-based gas. Thus, groove 73 is formed. Since the width of opening portion 36a is narrower than the width of groove 71, first passivation film 41 and resin 51 remain on both sides of groove 73. Therefore, the side surfaces of n-type contact layer 21, light receiving layer 22, n-type wide gap layer 23a, p-type wide gap layer 23b, and p-type contact layer 24 are not exposed to the fluorine-based gas during the dry etching. As a result, the side surfaces of n-type contact layer 21, light receiving layer 22, n-type wide gap layer 23a, p-type wide gap layer 23b, and p-type contact layer 24 are not damaged. N-type contact layer 21 is exposed at the bottom surface of groove 73, and first passivation film 41, resin 51, second passivation film 42, and third passivation film 43 are exposed at the side surface of groove 73. The fluorine-based gas is, for example, $CF_4$ gas or $SF_6$ gas.

Figure 27:
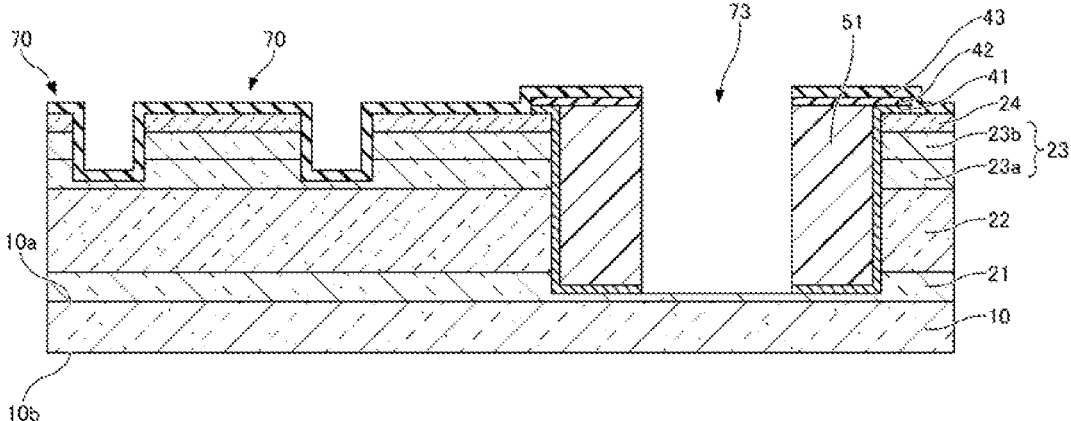
FIG. 27 is a cross-sectional view (part 25) illustrating a method of manufacturing a light-receiving element according to the embodiment.

Next, as shown in FIG. 27, resist pattern 36 is removed with an organic solvent or the like.

Figure 28:
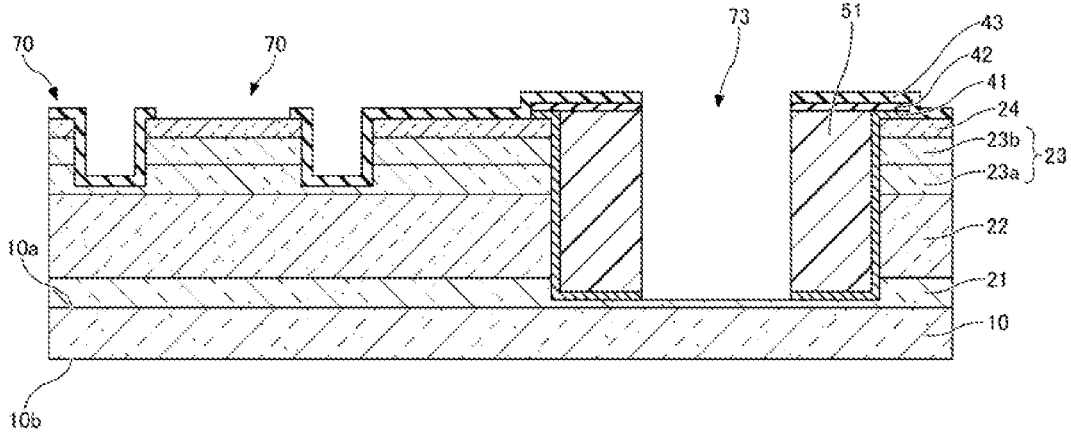
FIG. 28 is a cross-sectional view (part 26) illustrating a method of manufacturing a light-receiving element according to the embodiment.

Next, as shown in FIG. 28, a portion of third passivation film 43 in mesa 70 is removed to expose p-type contact layer 24. Specifically, a photoresist is applied on third passivation film 43, and exposure and development are performed with an exposure device to form a resist pattern (not shown). The resist pattern has an opening portion in a region where p-electrode 62 is formed, and third passivation film 43 in the opening portion of the resist pattern is removed by dry etching to expose the surface of p-type contact layer 24.

Figure 29:
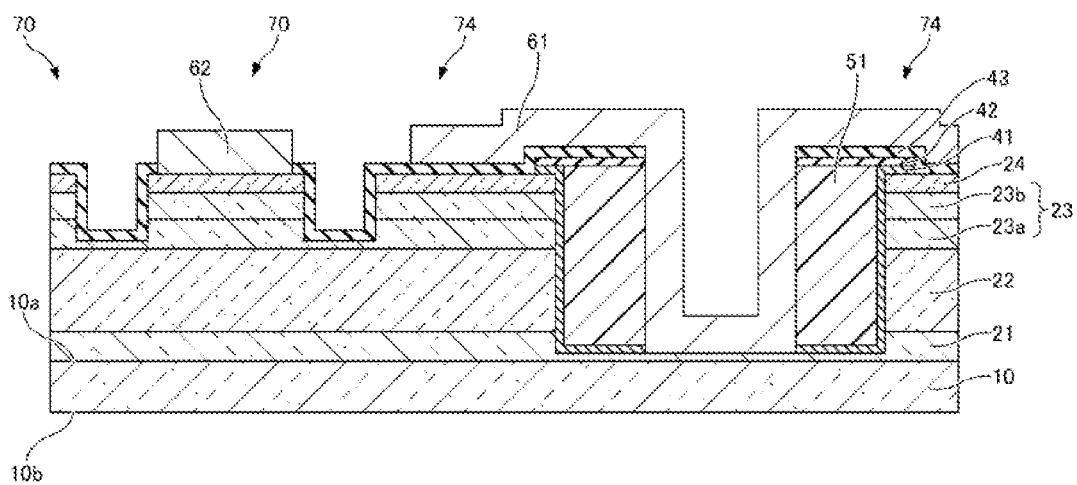
FIG. 29 is a cross-sectional view (part 27) illustrating a method of manufacturing a light-receiving element according to the embodiment.

Next, as shown in FIG. 29, n-electrode 61 is formed on n-type contact layer 21, on the side surface of groove 73 and on third passivation film 43 in a mesa 74 on the outer periphery, and p-electrode 62 is formed on p-type contact layer 24 in mesa 70. N-electrode 61 and p-electrode 62 are formed using a lift-off method. Specifically, a resist pattern having an opening portion is formed in a region where each electrode is formed, a metal film is formed using EB vapor deposition, and then the metal film on the resist pattern is removed together with the resist pattern by immersion in an organic solvent or the like. N-electrode 61 and p-electrode 62 are formed of, for example, a stacked film of a Ti film, a Pt film, and an Au film.

Figure 30:
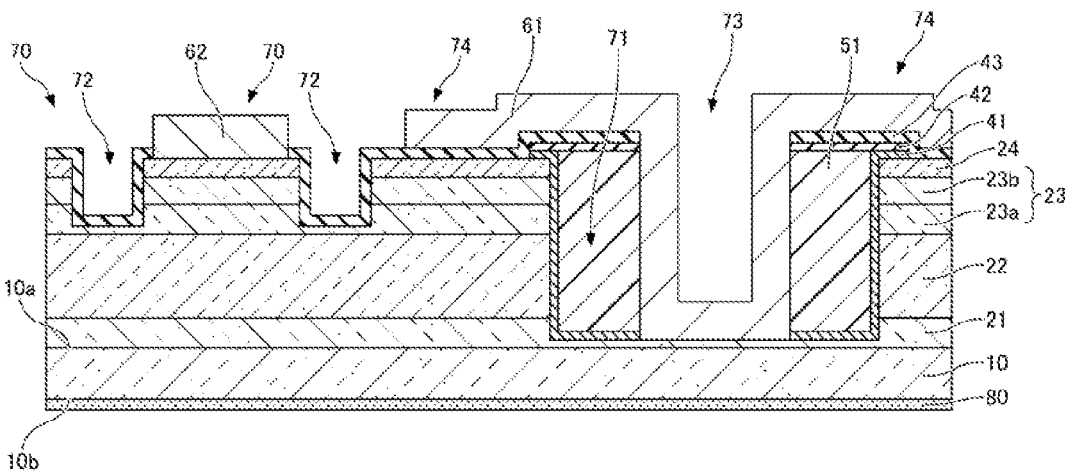
FIG. 30 is a cross-sectional view (part 28) illustrating a method of manufacturing a light-receiving element according to the embodiment.

Next, as shown in FIG. 30, anti-reflection film 80 is formed on second main surface 10b of substrate 10 using plasma CVD. Anti-reflection film 80 is, for example, an SiN film. An SiON film may be used instead of the SiN film. As described above, light-receiving element 100 according to the embodiment can be manufactured.

As described above, in the method of manufacturing light-receiving element 100 according to the embodiment, groove 72 for pixel separation is formed after groove 71 for electrode extraction is formed. In this case, when an SiN film or an $SiO_2$ film for the etching mask for forming groove 71 is deposited, the side surface of mesa 70 forming the pixel is not exposed. Therefore, it is possible to reduce damage to the side surface of mesa 70 during deposition of the SiN film or the $SiO_2$ film for the etching mask for forming groove 71. As a result, the leakage current can be reduced.

Although light-receiving element 100 is a two dimensional array type in the above embodiment, the present disclosure is not limited thereto. For example, light-receiving element 100 may be a one dimensional array of pixels separated by groove 72.

Although the embodiment have been described in detail above, the present invention is not limited to a specific embodiment, and various modifications and changes can be made within the scope described in the claims.

What is claimed is:

1. A method of manufacturing a light-receiving element, the method comprising:
   (a) forming a first contact layer on one surface of a substrate;
   (b) forming a light receiving layer on the first contact layer;
   (c) forming a second contact layer on the light receiving layer;
   (d) etching the second contact layer, the light receiving layer and the first contact layer to define a first groove that exposes the first contact layer;
   (e) depositing a first electrically-insulating passivation film on at least a bottom and sidewalls of the first groove;
   (f) filling the first groove with a resin so that an upper surface of the resin is substantially flush with an upper surface of the second contact layer;
   (g) after step (f), depositing a second electrically-insulating film over the resin, the second electrically-insulating film having an etch-rate lower than a silicon-nitride etching mask that is subsequently-used;
   (h) through the silicon-nitride etching mask, removing the second contact layer and thereby forming a second groove that separates adjacent pixels, while leaving the second electrically-insulating film in place on the resin when the mask is stripped; and
   (i) connecting electrodes to the first and second contact layers.

2. The method of manufacturing the light-receiving element according to claim 1, the method further comprising:
   after forming the second groove, removing a damaged layer.

3. The method of manufacturing the light-receiving element according to claim 1,
   wherein the resin is a benzocyclobutene resin or a polyimide resin.

4. A light-receiving element comprising:
   a substrate;
   a first contact layer provided at one surface of the substrate;
   a light-receiving layer provided on the first contact layer;
   a second contact layer provided on the light-receiving layer;
   a first groove in which a portion of each portions of the second contact layer and the light-receiving layer are removed to expose the first contact layer is removed;
   a first electrically-insulating passivation film disposed on at least a bottom and at which the first contact layer is exposed;
   a resin provided in a portion of an inside sidewalls of the first groove;
   a resin filling the first groove so that an upper surface of the resin is substantially flush with an upper surface of the second contact layer;

a second groove at which electrically-insulating film disposed over the resin within the first groove, the second electrically-insulating film having, in buffered hydrofluoric acid, an etch rate lower than that of silicon nitride;

and a second groove extending at least through the second contact layer is removed and separating between adjacent pixels to separate the pixels.

5. A method of manufacturing a light-receiving element, the method comprising:

forming a first contact layer on one surface of a substrate;

forming a light-receiving layer on the first contact layer;

forming a second contact layer on the light-receiving layer;

etching the second contact layer, the light-receiving layer, and the first contact layer to form a first groove in which the first contact layer is exposed;

wet-etching exposed semiconductor surfaces in the first groove with a hydrochloric-acid-based etchant to remove plasma-damaged material while leaving at least a portion of the first contact layer intact;

depositing a first passivation film composed of silicon nitride or silicon oxide, the film having a thickness of 100 nm to 400 nm, on the bottom and sidewalls of the first groove;

filling the first groove with a resin selected from benzocyclobutene or polyimide and planarising the resin so that an upper surface of the resin is substantially flush with an upper surface of the second contact layer;

after filling the first groove, depositing a second passivation film composed of silicon nitride or silicon oxide, the film having a thickness of 50 nm to 200 nm, over the resin;

through a silicon-nitride etching mask whose etch rate in buffered hydrofluoric acid is at least twice that of the first and second passivation films, removing the second contact layer and wide-gap layers to form a second groove that separates adjacent pixels while leaving the first and second passivation films in place when the mask is stripped;

wet-etching semiconductor surfaces exposed in the second groove with the hydrochloric-acid-based etchant to remove plasma-damaged material;

depositing a third passivation film on the bottom and sidewalls of the second groove; and, after depositing the third passivation film, providing electrodes that contact the first and second contact layers.

\* \* \* \* \*